US007713801B2

(12) United States Patent
Trivedi et al.

(10) Patent No.: US 7,713,801 B2
(45) Date of Patent: May 11, 2010

(54) METHOD OF MAKING A SEMICONDUCTOR STRUCTURE UTILIZING SPACER REMOVAL AND SEMICONDUCTOR STRUCTURE

(76) Inventors: Vishal P. Trivedi, 5700 Tapadera Trace La. #1031, Austin, TX (US) 78727;
Dharmesh Jawarani, 16900 Willow Oak La., Round Rock, TX (US) 78681;
Michael D. Turner, 322 Thorman Pl., San Antonio, TX (US) 78209

( * ) Notice: Subject to any disclaimer, the term of this patent is extended or adjusted under 35 U.S.C. 154(b) by 287 days.

(21) Appl. No.: 11/694,264

(22) Filed: Mar. 30, 2007

(65) Prior Publication Data

US 2008/0242094 A1    Oct. 2, 2008

(51) Int. Cl.
*H01L 21/00* (2006.01)
*H01L 21/84* (2006.01)
*H01L 21/311* (2006.01)
(52) U.S. Cl. .......................... 438/154; 438/696; 438/703
(58) Field of Classification Search ................. 438/154, 438/696, 703; 257/E21.001
See application file for complete search history.

(56) References Cited

U.S. PATENT DOCUMENTS 5,959,337 A    9/1999    Gardner et al.

| 6,451,693 | B1 * | 9/2002 | Woo et al. | 438/682 |
| 6,596,599 | B1 | 7/2003 | Guo | |
| 7,445,978 | B2 * | 11/2008 | Teh et al. | 438/199 |
| 2007/0281410 | A1 * | 12/2007 | Lee et al. | 438/197 |
| 2008/0217663 | A1 * | 9/2008 | Doris et al. | 257/274 |

OTHER PUBLICATIONS

X. Chen, et al., "Stress Proximity Technique For Performance Improvement With Dual Stress Liner At 45NM Technology and Beyond," 2006 Symposium on VLSI Technology, Digest of Technical Papers.
A. Nagy, et al., "IDSAT Enhancement Using Tin Disposable Spacer Over A SI3N4 Liner", IP.com Prior Art Database, IP.com number IPCOM000152863D, IP.com Electronic Publication May 15, 2007.

* cited by examiner

*Primary Examiner*—William M. Brewster
(74) *Attorney, Agent, or Firm*—Kim-Marie Vo; David G. Dolezal

(57) ABSTRACT

A method for making a semiconductor structure (10) includes providing a wafer with a structure (16) having a sidewall, forming a sidewall spacer (22) adjacent to the sidewall, and forming a layer of material (28) over the wafer including over the sidewall spacer and over the structure having the sidewall. The method further includes etching the layer, wherein the etching (i) leaves at least portions of the sidewall spacer exposed and (ii) leaves a portion of the layer located over the structure having a sidewall. The portion of the layer located over the structure having a sidewall is reduced in thickness by the etching. Subsequent to etching the layer, the method includes removing the sidewall spacer.

9 Claims, 6 Drawing Sheets

METHOD OF MAKING A SEMICONDUCTOR STRUCTURE UTILIZING SPACER REMOVAL AND SEMICONDUCTOR STRUCTURE

BACKGROUND

1. Field

This disclosure relates generally to semiconductor structures, and more specifically, to a method of making a semiconductor structure utilizing spacer removal and semiconductor device.

2. Related Art

Semiconductor structure manufacturing is a continually developing technology. For example, stressor ILD materials have been used for providing enhancement to device performance. However, techniques for safely removing a gate spacer after silicidation in an effort to locate the stressor ILD closer to the device channel are needed, in which damage to the device silicide regions is avoided. In addition, Miller capacitance undesirably increases as pitch and spacer thickness is reduced, which further leads to circuit performance degradation.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
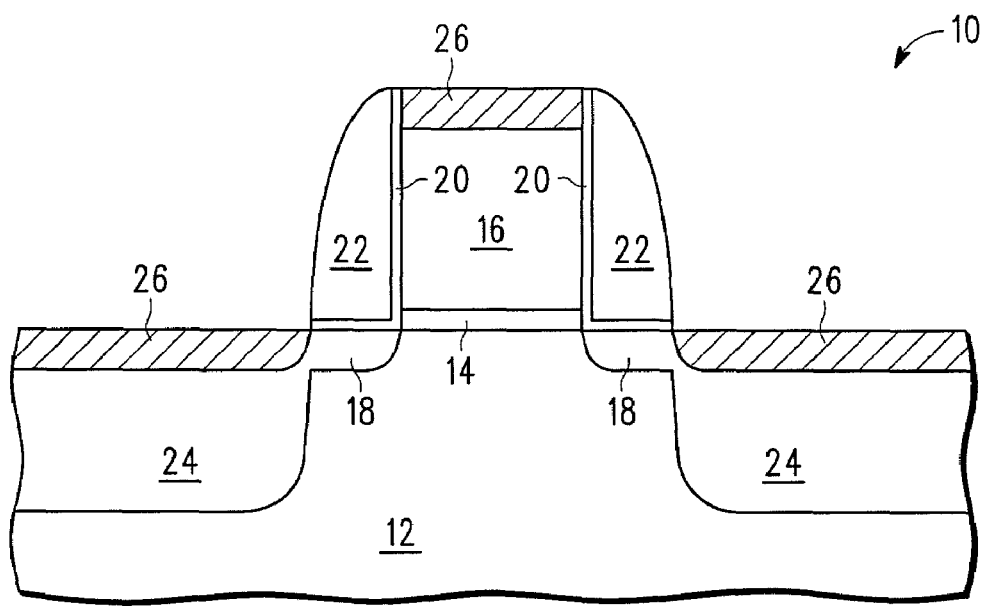
FIGS. 1-5 are cross-sectional views of a portion of a semiconductor structure at various stages of a method for making the same, according to one embodiment of the present disclosure.

As discussed herein, the embodiments of the present disclosure provide a method for removing a gate spacer pre- or post-silicide without damaging semiconductor or silicide not covered by the spacer. In the absence of the embodiments of the present disclosure, exposed portions of semiconductor or silicide were subject to active pitting due to spacer etchant. The process according to the embodiments of the present disclosure also enables formation of an air-gap spacer for a low-k spacer to minimize parasitic capacitance (e.g., Miller capacitance).

With respect to the embodiments of the present disclosure and the disposable spacers pre- or post-silicide, a need has arisen in the context of ultra shallow (e.g., less than 20 nm) and abrupt (e.g., less than 4 nm/decade) source/drain (S/D) extension junctions for advanced MOSFET devices. For the ultra shallow devices, lower spike (Spk) temperature, for example, low Dt (e.g., corresponding to a thermal budget referred to herein as Dt), is needed to be used to activate and diffuse both the lightly doped drain (LDD) (also referred to as the S/D extension) regions and deep S/D regions. However, lower Dt also impacts the deep S/D regions, which can result in performance degradation through junction capacitance, series resistance, etc. Accordingly, the embodiments of the present disclosure advantageously separate Dt for the deep S/D regions and S/D extension regions using a deep S/D first integration with disposable spacer.

In one embodiment, the S/D first integration with disposable spacer flow includes gate formation, spacer liner formation, disposable spacer formation, S/D implants, a high Dt (e.g., diffusion temperature and time on the order of approximately 1050° C. of a given duration) Spk anneal, disposable spacer removal (e.g., using a suitable hot phosphoric acid), spacer liner removal (e.g., dilute HF for UDOX (undensified oxide)), S/D extension implants, low Dt (e.g., on the order of approximately less than 1000° C. of a given duration) Spk anneal, and thereafter followed by additional process steps suitable for use in the given semiconductor device fabrication. In addition, the embodiments provide protection to active regions during disposable spacer removal and thereby advantageously avoid pitting of the active regions, independent of spacer liner thickness.

According to one embodiment of the present disclosure, a method is provided to remove a spacer post-silicide to enable formation of a stressed ILD layer in close proximity to the channel for achieving a highly strained channel. The method further provides protection for an underlying semiconductor or silicide from the spacer etchant, wherein the method includes depositing films with minimal step coverage to form a much thicker protective layer on top of the semiconductor or silicide that is not covered by spacer material than on the spacer sidewalls. Furthermore, according to another embodiment, the method enables a reduction in parasitic capacitance to improve device performance.

With one of the embodiments of the present disclosure, a percentage performance enhancement of on the order of up to 30-50% for pFET and 8-12% nFET improvement is projected.

The semiconductor substrate described herein can be any semiconductor material or combinations of materials, such as gallium arsenide, silicon germanium, silicon-on-insulator (SOI), silicon, monocrystalline silicon, the like, and combinations of the above.

FIGS. 1-5 are cross-sectional views of a portion of a semiconductor structure at various stages of a method for making the same, according to one embodiment of the present disclosure. Referring now to FIG. 1, the method of forming semiconductor structure 10 begins with providing a semiconductor substrate 12, a gate dielectric 14, a gate electrode 16, source/drain extension regions 18, sidewall spacer liners 20, sidewall spacers 22, deep source/drain regions 24, and silicide regions 26, all formed using any suitable semiconductor processing techniques. Semiconductor structure 10 can include a PMOS device or an NMOS device, according to the requirements of a given semiconductor device application. In addition, the particular composition of the gate dielectric 14 and the gate electrode 16 are determined according to the requirements of the particular semiconductor device application.

Figure 2:
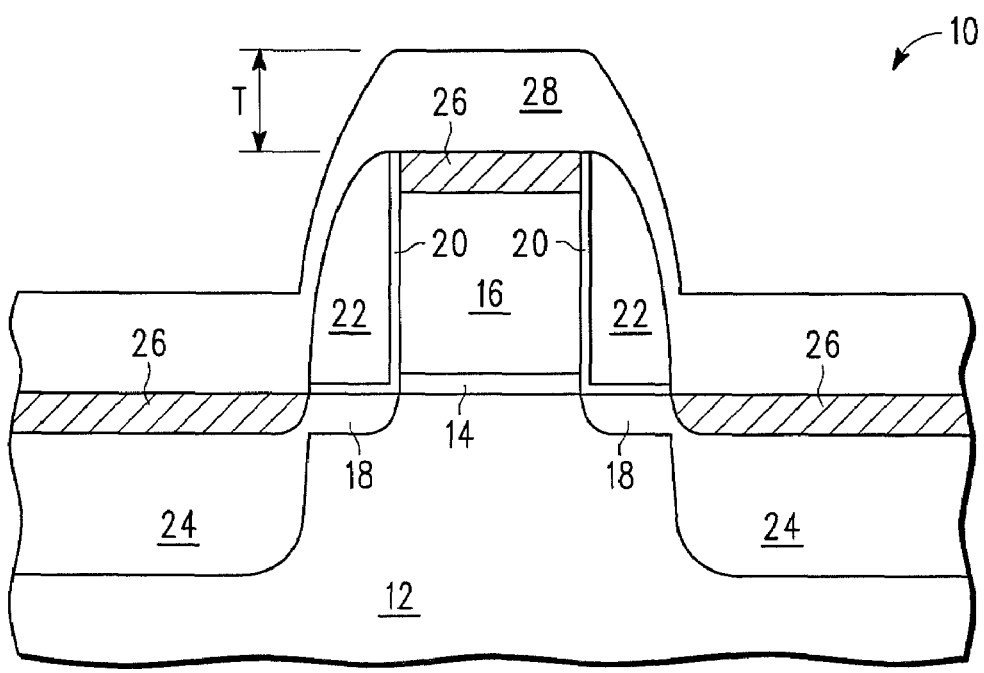

In FIG. 2, a layer 28 of low-step coverage material is deposited overlying the semiconductor structure 10. Low-step coverage as used herein shall include a step coverage of typically fifty percent (50%) percent or less. The characteristics of the film deposition over the gate and/or gate-spacer stack are such that the thickness of the deposited film on the side of the stack is noticeably thinner than on the horizontal surfaces. The deposited low-step coverage film material includes a thickness T on top of all horizontal regions, including the silicide regions 26, and a film thickness of approximately 0.5 T on the spacer sidewalls. In other words, the thickness of the film deposition on the side of the stack is on the order of fifty percent (50%) of the thickness on the horizontal surfaces. In one embodiment, the low-step coverage material comprises a HDP PECVD (High Density Plasma, Plasma Enhanced Chemical Vapor Deposition) oxide.

Figure 3:
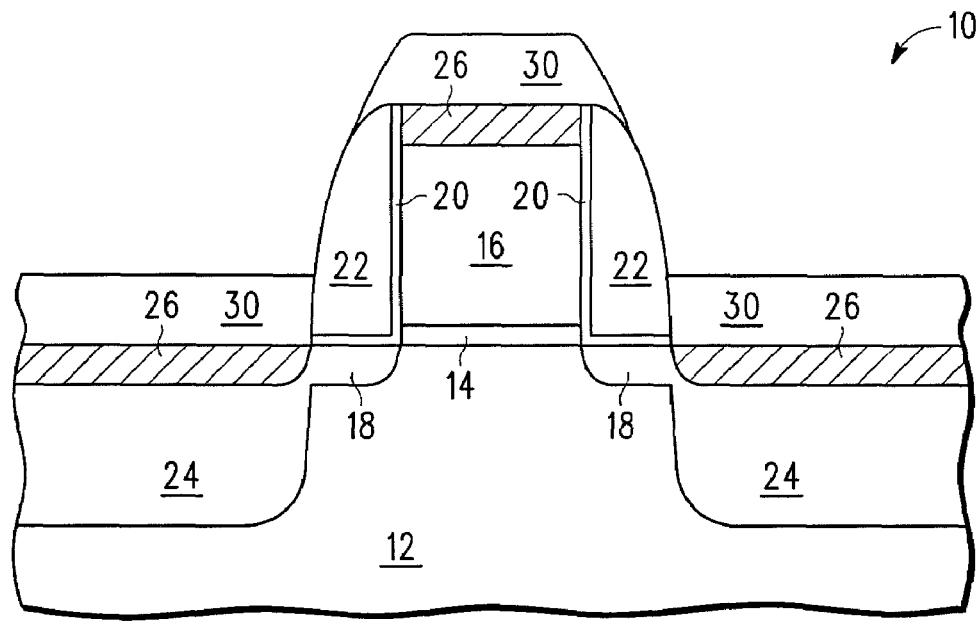

Turning now to FIG. 3, the structure of FIG. 2 is subjected to a wet etch to remove approximately seventy five percent (75%) of the deposited low-step coverage material. In particular, the wet etch removes the low-step coverage film 28 from a side portion of the spacer while keeping approximately 25% of the film over the horizontal silicided regions. The remaining low-step coverage material is indicated by reference numeral 30. In particular, the wet etch exposes a portion of sidewall spacers 22. The wet etch comprises, for example, a dilute hydrofluoric (HF) etch. In addition, in one embodiment, the wet etch includes up to a thirty percent 30% overetch.

Figure 4:
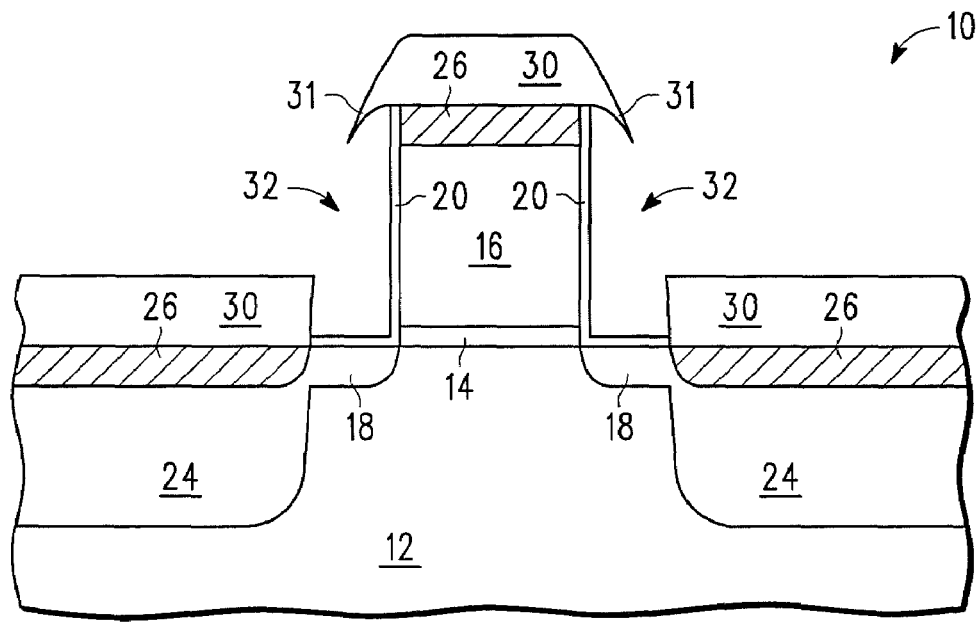

Turning now to FIG. 4, the structure of FIG. 3 is subjected to a suitable wet etch to remove sidewall spacers 22, wherein the wet etch is selective to the spacer liners 20. The wet etch removes the sidewall spacers 22 via the previously exposed portions of the sidewall spacers. The wet etch comprises, for example, a hot phosphoric etch. Removal of the sidewall spacers 22 creates openings or voids, generally indicated by reference numeral 32. In addition, as a result of the removal of the sidewall spacers 22, portions of the material 30 form overhang regions 31. Furthermore, the material 30 overlying the horizontal silicided regions 26 provides suitable protection of the silicided regions during the wet etch removal of the sidewall spacers 22. Accordingly, the integrity of the silicided regions 26 is advantageously maintained. In addition, selectivity of the spacer 22 etch over the deposited film 30 can be optimized by, for example, by using an undensified spacer and/or selecting a more suitable film material.

Figure 5:
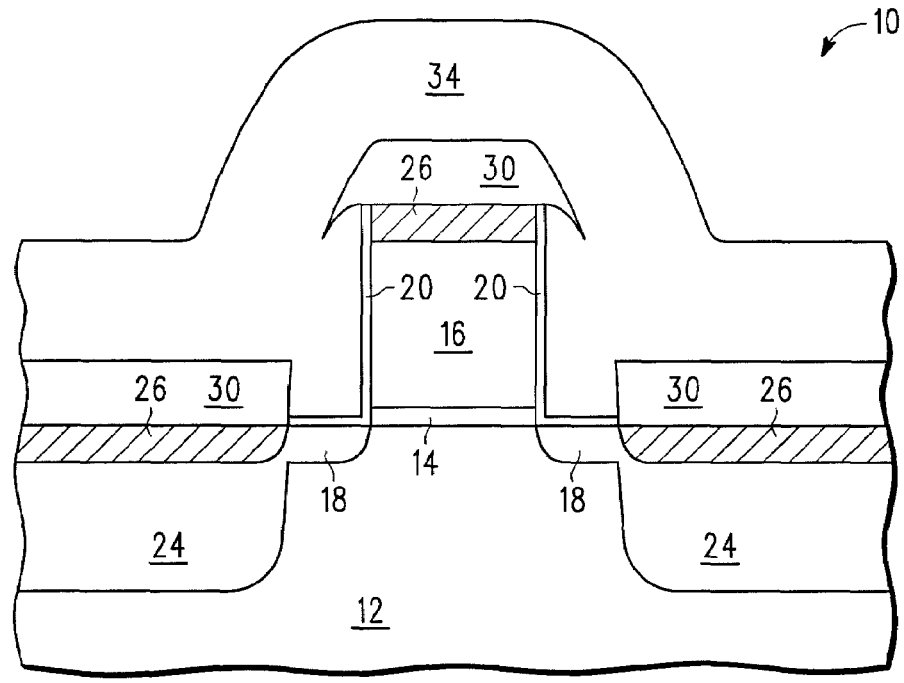

Subsequent to removal of the sidewall spacers 22 and the creation of voids 32, a stressor inter-layer dielectric ILD is conformally deposited over the semiconductor structure 10, as shown in FIG. 5. The stressor ILD material 34 can comprise any suitable stressor ILD material selected according to the requirements of a given semiconductor device application. Removal of the sidewall spacers 22 advantageously enables placement of the stressor ILD material in close proximity to the underlying channel of the semiconductor substrate 12, not previously achieved. In particular, the stressor ILD material is located within at least the thickness of the spacer liner 20 from the channel region of the active semiconductor material of substrate 12 and/or the gate electrode 16. Accordingly, the stressor ILD material and its close proximity to the channel region can be selected for providing a given stress enhancement to the semiconductor structure 10 to thereby achieve a desired device performance. For NMOS device structures, a tensile stressor ILD material can be used. For PMOS device structures, a compressive ILD material can be used.

Figure 6:
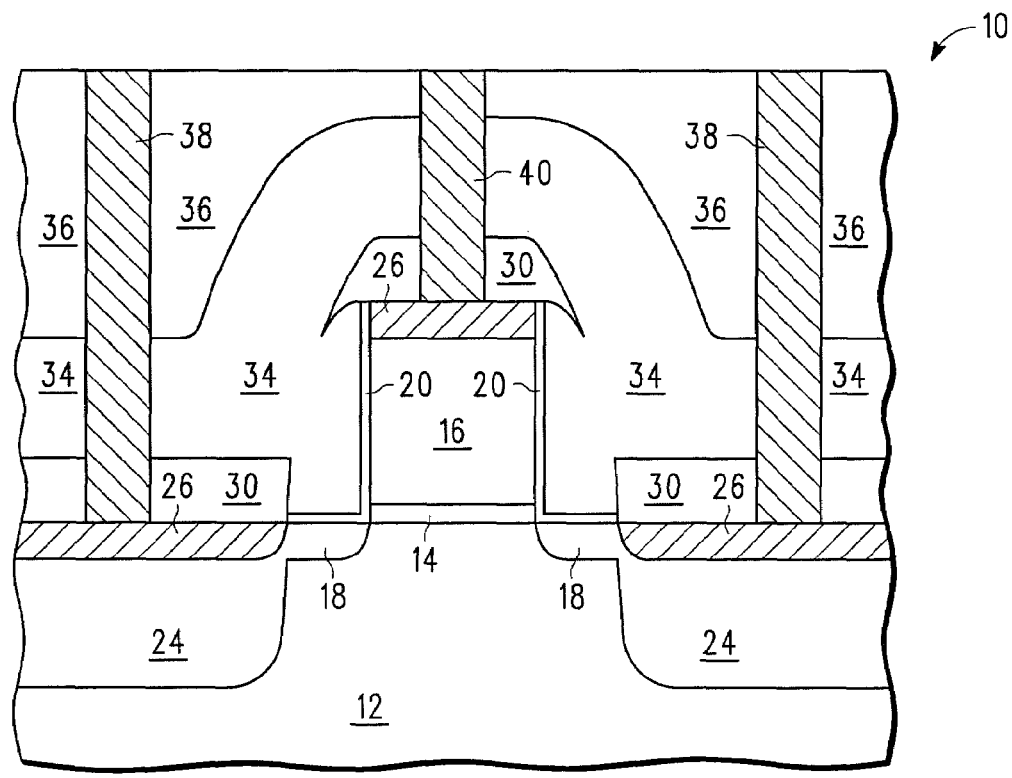
FIG. 6 is a cross-sectional view of a portion of a semiconductor structure formed by a method according to the embodiments of the present disclosure.

FIG. 6 is a cross-sectional view of a portion of a semiconductor structure 10 formed by a method according to the embodiments of the present disclosure. In particular, subsequent to conformal deposition of the stressor ILD material 34, a further ILD layer 36 is deposited and planarized, using suitable techniques known in the art. Following planarization of the further ILD layer 36, source/drain contacts 38 and gate contact 40 are formed using suitable techniques known in the art.

Figure 7:
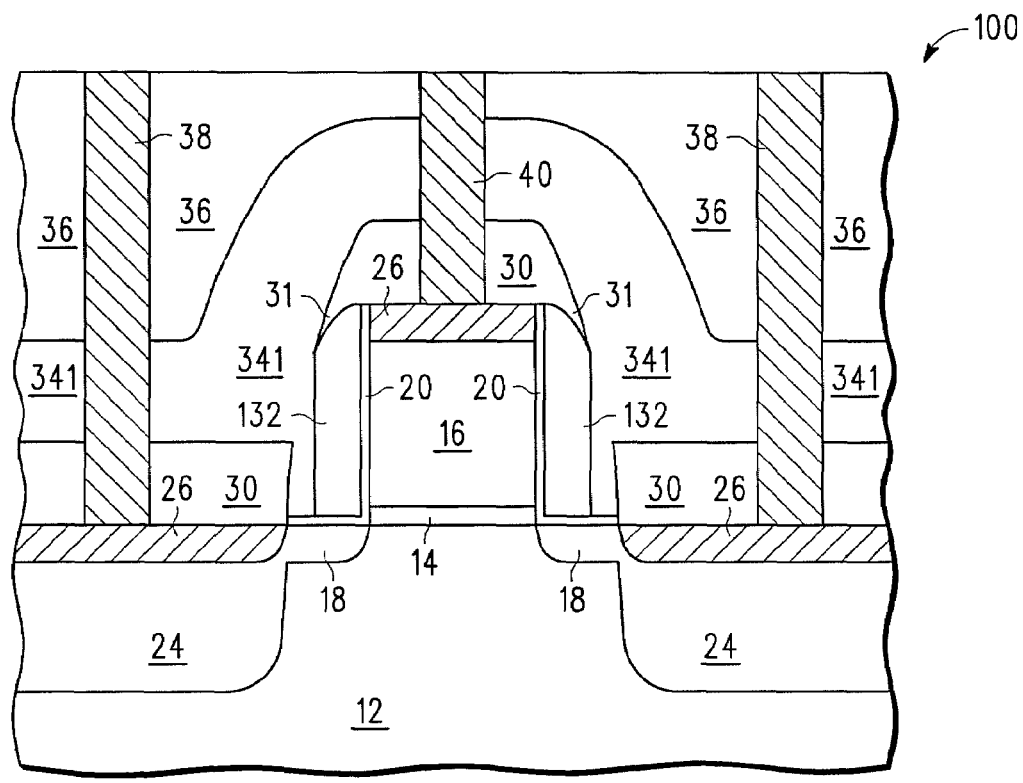
FIG. 7 is a cross-sectional view of a portion of a semiconductor structure formed by a method according to another embodiment of the present disclosure.

FIG. 7 is a cross-sectional view of a portion of a semiconductor structure 100 formed by a method according to another embodiment of the present disclosure. Structure 100 is similar to the structure 10 illustrated in FIG. 6 with the following difference. Structure 100 includes air gaps 132 in the location generally occupied by former sidewall spacers 22. Prior to spacer removal, the etch time for layer 28 can be reduced to achieve a desired resultant greater overhang. For example, the HF etch time can be adjusted for exposing the sidewall spacers in a manner that leaves more of an overhang at the sidewalls of the gate electrode. Following removal of the sidewall spacers 22, as discussed herein above in connection with FIG. 4, an ILD material 341 is deposited, the ILD material deposition being characterized as unidirectional rather than conformal. With the presence of the overhanging portions 31 of material layer 30, the unidirectional deposition of the ILD material 341 results in the creation of air gaps 132. Subsequent to the ILD material 341 deposition, processing continues similarly as discussed herein above with reference to FIG. 6. In the embodiment of semiconductor structure 100 of FIG. 7, the presence of air gaps 132 advantageously provides a low-k spacer to minimize parasitic capacitance (e.g., Miller capacitance). In addition, the embodiments of FIG. 7 advantageously require no additional or extra masking steps to achieve the air-gap spacer(s).

Figure 8:
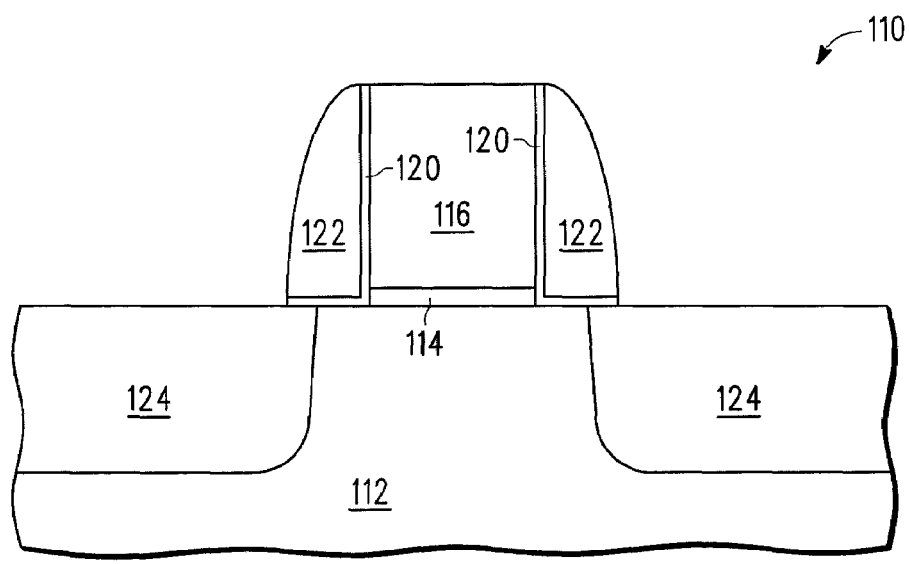
FIGS. 8-12 are cross-sectional views of a portion of a semiconductor structure at various stages of a method for making the same, according to another embodiment of the present disclosure.

FIGS. 8-12 are cross-sectional views of a portion of a semiconductor structure at various stages of a method for making the same, according to another embodiment of the present disclosure. Referring now to FIG. 8, the method of forming semiconductor structure 110 begins with providing a semiconductor substrate 112, a gate dielectric 114, a gate electrode 116, sidewall spacer liners 120, sidewall spacers 122 and deep source/drain regions 124, all formed using any suitable semiconductor processing techniques. Semiconductor structure 110 can include a PMOS device or an NMOS device, according to the requirements of a given semiconductor device application. In addition, the particular composition of the gate dielectric 114 and the gate electrode 116 are determined according to the requirements of the particular semiconductor device application. Note that in FIG. 8, source/drain extension regions and silicide regions have not yet been formed.

Figure 9:
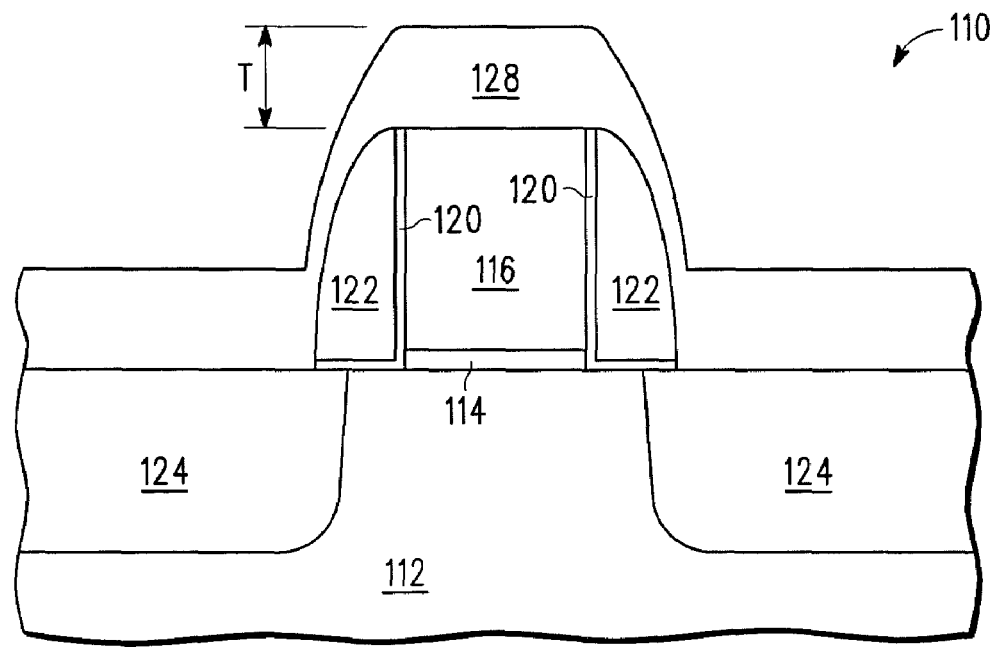

Turning now to FIG. 9, a layer 128 of low-step coverage material is deposited overlying the semiconductor structure 110. Low-step coverage as used herein shall include step coverage of typically 50 percent or less. The characteristics of the film deposition over the gate and/or gate-spacer stack are such that the thickness of the deposited film on the side of the stack is noticeably thinner than on the horizontal surfaces. The deposited low-step coverage film material includes a thickness T on top of all horizontal regions, and a film thickness of approximately 0.5 T on the spacer sidewalls. In other words, the thickness of the film deposition on the side of the stack is on the order of fifty percent (50%) of the thickness on the horizontal surfaces. In one embodiment, the low-step coverage material comprises a HDP PECVD oxide.

Figure 10:
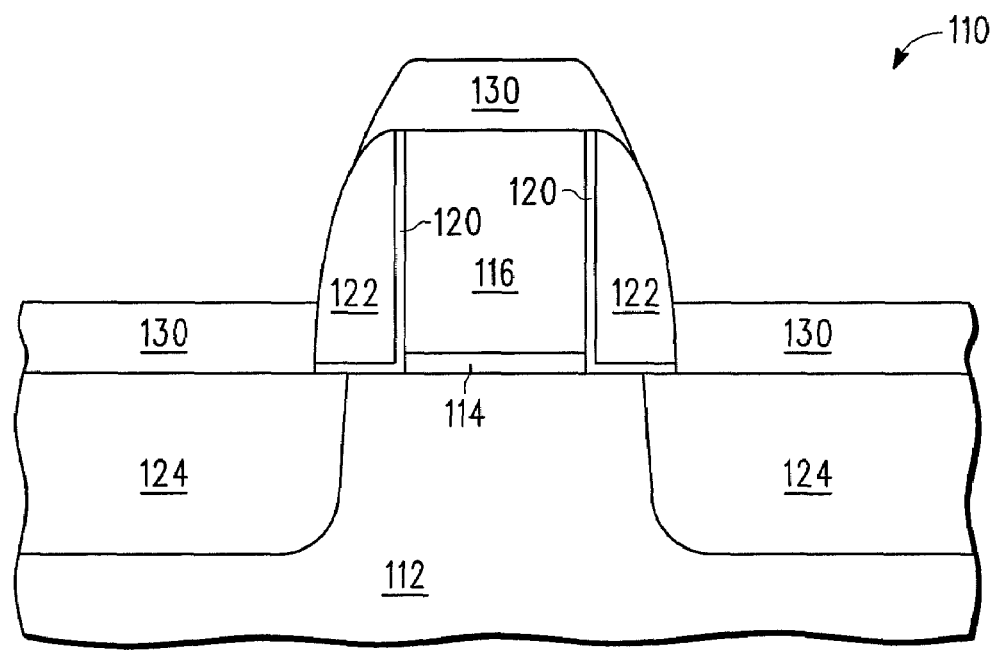

Turning now to FIG. 10, the structure of FIG. 9 is subjected to a wet etch to remove approximately seventy five percent (75%) of the deposited low-step coverage material. In particular, the wet etch removes the low-step coverage film 128 from a top side portion of the spacer while keeping approximately 25% of the film over the horizontal regions. The remaining low-step coverage material is indicated by reference numeral 130. In particular, the wet etch exposes a portion of sidewall spacers 122. The wet etch comprises, for example, a dilute hydrofluoric (HF) etch. In addition, in one embodiment, the wet etch includes up to a thirty percent (30%) overetch.

Figure 11:
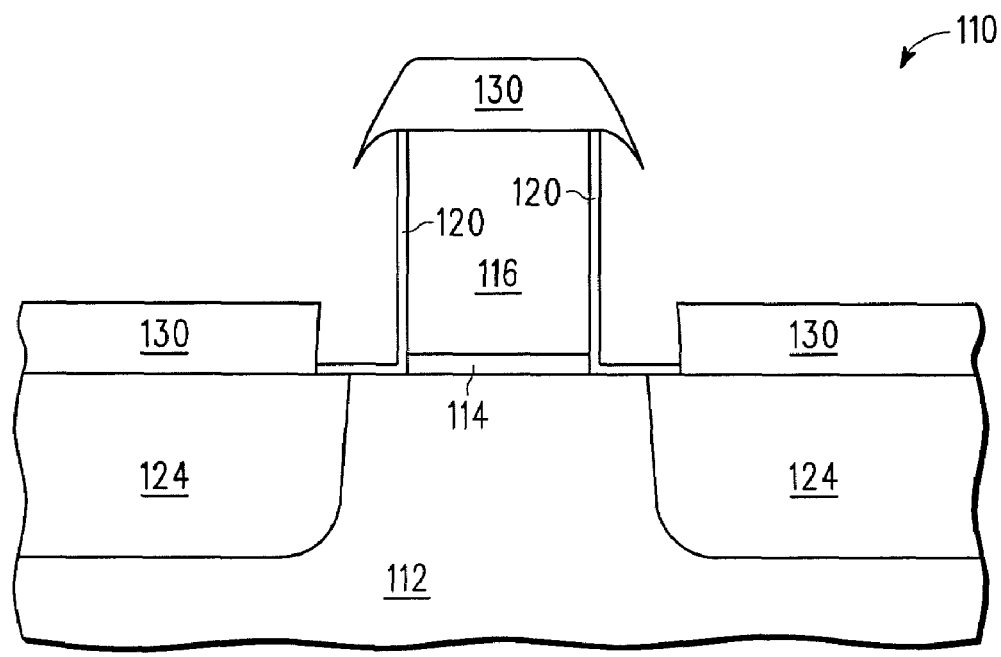

Turning now to FIG. 11, the structure of FIG. 10 is subjected to a suitable wet etch to remove sidewall spacers 122, wherein the wet etch is selective to the spacer liners 120. The wet etch removes the sidewall spacers 122 via the previously exposed portions of the sidewall spacers. The wet etch comprises, for example, a hot phosphoric etch. Removal of the sidewall spacers 122 creates openings or voids. In addition, selectivity of the spacer 122 etch over the deposited film 130 can be optimized by, for example, by using an undensified spacer and/or selecting a more suitable film material.

Figure 12:
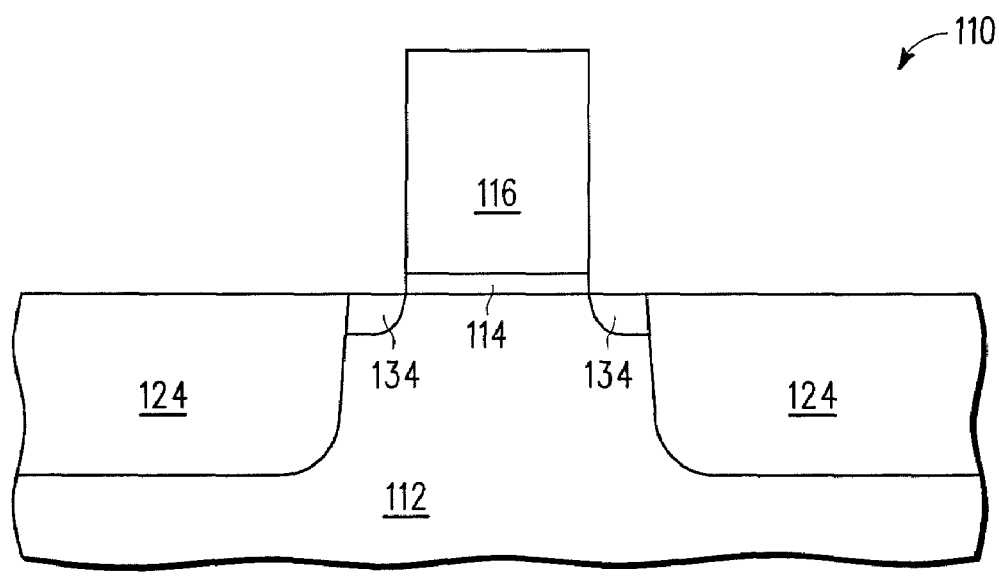

Turning now to FIG. 12, the structure of FIG. 11 is subjected to a suitable wet etch to remove material 130 as well as sidewall liners 120. The resulting structure is then processed to form source/drain extension regions 134, using suitable source/drain extension formation techniques. The embodiments of FIGS. 10-12 advantageously separate Dt for the deep S/D regions and Dt for the S/D extension regions using a deep S/D first integration with disposable spacer. Subsequently, the structure 110 of FIG. 12 may be further processed to realize a structure similar to that as shown in FIG. 1, including silicide regions 26. Furthermore, processing of the corresponding structure continues as discussed herein with respect to FIGS. 1-6 or 7.

By now it should be appreciated that there has been provided a method for making a semiconductor structure includes providing a wafer with a structure having a sidewall, forming a sidewall spacer adjacent to the sidewall, and forming a layer of material over the wafer including over the sidewall spacer and over the structure having the sidewall. The method further includes etching the layer, wherein the etching (i) leaves at least portions of the sidewall spacer exposed and (ii) leaves a portion of the layer located over the structure having a sidewall, wherein the portion of the layer located over the structure having a sidewall is reduced in thickness by the etching. Etching leaves portions of the layer on horizontal surfaces of the wafer. Subsequent to etching the layer, the method includes removing the sidewall spacer.

In another embodiment, the method further includes forming a silicide on the wafer prior to forming the layer, wherein etching the layer of material leaves a portion of the layer over the silicide. In addition, removing the sidewall spacer is performed after forming the silicide. In such an instance, the portion of the layer of material over the silicide protects the silicide during the removal of the sidewall spacer.

In another embodiment, the layer of material comprises a layer having a low step coverage. For example, step coverage of the layer can include on the order of fifty percent or less (50% or less).

In one embodiment, the etching includes utilizing a wet etch. For example, the wet etch can include an etch chemistry of dilute hydrofluoric acid.

Providing a structure with a sidewall can include forming a control electrode structure over a substrate of the wafer. In addition, the sidewall comprises a sidewall of the control electrode structure. In another embodiment, the sidewall spacer is located over a first region of a substrate of the wafer. The method further comprises implanting dopants into the first region after removing the sidewall spacer. The dopants implanted into the first region of the substrate form a lightly doped current terminal region of a transistor.

The method can further comprise forming a layer of stressor material over the wafer after removing the sidewall spacer. At least a portion of the stressor material is located at a location where the sidewall spacer was previously located. In addition, providing a structure with a sidewall can include forming a control electrode structure over a substrate of the wafer, wherein the control electrode structure is located over a channel region of a transistor in the substrate, wherein the sidewall is a sidewall of the control electrode structure, and wherein the layer of stressor material imparts a stress on the channel region. In one embodiment, the layer of stressor material is characterized as a dielectric material.

In another embodiment, the method includes forming the layer of material by utilizing a plasma deposition process. In the plasma deposition process, the wafer is not externally biased during deposition of the material of the layer to thereby inhibit a sputtering component of the plasma deposition process.

In a still further embodiment, the method further comprises forming a second layer of material over the wafer after removing the sidewall spacer. In such an instance, the second layer forms an air gap, wherein at least a portion of the air gap is located at a location where the sidewall spacer was previously located. Furthermore, the method also includes providing a wafer with a structure having a sidewall. The wafer with a structure having a sidewall includes forming a control electrode structure over a substrate of the wafer. The sidewall is a sidewall of the control electrode structure. The control electrode structure is to be utilized as a control electrode for a transistor. The method further comprises forming a current terminal contact for electrical connection to a current terminal region of the transistor. Accordingly, the air gap is located between the control electrode structure and the current terminal contact.

In one embodiment, the sidewall spacer includes silicon nitride and the layer includes an oxide. In addition, portions of the layer left by the etching protect surfaces located under those portions during the removal of the sidewall spacer. Still further, the removing of the sidewall spacer includes performing a hot phosphoric wet etch of material of the sidewall spacer, wherein material of the layer is etch selective to the hot phosphoric wet etch.

In yet another embodiment, a method for making a semiconductor structure comprises forming a control electrode structure over a substrate, the control electrode structure having a sidewall, forming a sidewall spacer adjacent to the sidewall, and forming a layer of material over the substrate, the control electrode structure, and the sidewall spacer. The method further includes etching the layer, wherein the etching (i) leaves at least portions of the sidewall spacer exposed and (ii) reduces in thickness portions of the layer located over the control electrode structure and portions of the layer over portions of the substrate. The method still further includes removing the sidewall spacer after etching the layer, the removing includes using an etchant that is etch selective to the material of the layer.

In a still further embodiment, a method of forming a semiconductor structure comprises forming a control electrode structure of a transistor over a substrate; forming a spacer adjacent to the control electrode structure; forming current terminal regions of the transistor in the substrate; forming silicide on the control electrode structure and forming silicide on the current terminal regions; forming a layer of material over the silicide on the control electrode structure, over the silicide on the current terminal regions, and over the spacer; etching the layer of material to expose at least portions of the spacer, wherein the etching leaves the silicide over the control electrode structure and the silicide over the current terminal regions covered by the layer of material; and removing the spacer after the etching.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a semiconductor structure, the method comprising:
   providing a wafer with a transistor comprising a control electrode overlying a substrate and having a sidewall;
   forming a sidewall spacer liner in contact with the sidewall of the control electrode to protect the control electrode;
   forming a sidewall spacer adjacent to the sidewall;
   forming a layer of material over the wafer including over the sidewall spacer and over the control electrode having the sidewall, the layer of material having a varying thickness wherein a thickness on all horizontal regions is substantially twice or more than a thickness on all vertical regions;
   etching the layer with a first wet etch, wherein the etching (i) leaves at least portions of the sidewall spacer exposed and (ii) leaves a portion of the layer located over the control electrode having a sidewall, wherein the portion of the layer located over the control electrode having a sidewall is reduced in thickness by the etching;
   removing with a second wet etch that is selective to the sidewall spacer liner the sidewall spacer after the etching the layer to expose the sidewall spacer liner, the control electrode being protected from the wet etch by both the portion of the layer located over the control electrode and the sidewall spacer liner; and
   protecting the control electrode from subsequent processing of the wafer with both the portion of the layer located over the control electrode and the sidewall spacer liner.

2. The method of claim 1 further comprising:
   forming a silicide on the wafer prior to forming the layer, wherein the etching leaves a portion of the layer over the silicide; and
   wherein the removing the sidewall spacer is performed after the forming a silicide.

3. The method of claim 2 wherein the portion of the layer over the silicide protects the silicide during the removing the sidewall spacer.

4. The method of claim 1 wherein the thickness of the layer of material on all vertical regions is 50% of the thickness of the layer of material on all horizontal regions.

5. The method of claim 1 wherein the wet etch is a hot phosphoric etch.

6. The method of claim 5 wherein selectivity of the second wet etch is increased by using an undensified sidewall spacer.

7. The method of claim 1 further comprising:
   conformally depositing a first ILD layer overlying the semiconductor structure;
   depositing a second ILD layer overlying the first ILD layer; and
   planarizing the second ILD layer.

8. The method of claim 1 wherein the sidewall spacer includes silicon nitride and the layer includes an oxide.

9. A method for making a semiconductor structure, the method comprising:
   forming a control electrode structure over a substrate, the control electrode structure having a sidewall;
   forming a sidewall spacer liner in contact with the sidewall of the control electrode structure to protect the control electrode structure;
   forming a sidewall spacer adjacent to the sidewall;
   forming a layer of material over the substrate, the control electrode structure, and the sidewall spacer, the layer of material having a varying thickness wherein a thickness on all vertical regions is substantially one-half a thickness on all horizontal regions;
   etching the layer with a wet etch, wherein the etching leaves at least portions of the sidewall spacer exposed and reduces in thickness portions of the layer located over the control electrode structure and portions of the layer over portions of the substrate; and
   removing the sidewall spacer after the etching the layer, wherein the removing includes using an etchant that is etch selective to the material of the layer, said removing exposing the sidewall spacer liner wherein the control electrode is protected from the removing by both the portions of the layer located over the control electrode structure and the sidewall spacer liner; and
   protecting the control electrode from subsequent processing of the semiconductor structure with both the portions of the layer located over the control electrode structure and the sidewall spacer liner.

* * * * *